United States Patent
Bazzani

[11] Patent Number: 6,087,896
[45] Date of Patent: Jul. 11, 2000

[54] COMPENSATION TECHNIQUE USING MOS CAPACITANCE

[75] Inventor: Cristiano Bazzani, Irvine, Calif.

[73] Assignee: Conexant Systems, Inc., Newport Beach, Calif.

[21] Appl. No.: 09/163,789

[22] Filed: Sep. 30, 1998

[51] Int. Cl.$^7$ .................................................. H01G 7/06
[52] U.S. Cl. ........................ 327/581; 327/429; 327/434; 257/369; 257/532
[58] Field of Search ................................... 327/427, 434, 327/391, 429, 437, 538, 539, 574, 581; 257/369, 371, 379, 393, 532

[56] References Cited

U.S. PATENT DOCUMENTS

| | | | |
|---|---|---|---|
| 4,937,476 | 6/1990 | Bazes | 327/541 |
| 5,360,989 | 11/1994 | Endo | 257/532 |
| 5,801,411 | 9/1998 | Klughart | 257/296 |
| 5,801,412 | 9/1998 | Tobita | 257/206 |
| 5,900,766 | 5/1999 | Naffziger et al. | 327/382 |
| 5,920,221 | 7/1999 | Shen et al. | 327/278 |

FOREIGN PATENT DOCUMENTS

0720238A2  12/1994  European Pat. Off. ........ H01L 29/94

*Primary Examiner*—Kenneth B. Wells
*Assistant Examiner*—Terry L. Englund
*Attorney, Agent, or Firm*—Snell & Wilmer L.L.P.

[57] ABSTRACT

Two FET transistors provide an electrical circuit characterized by a stable capacitance across a wide range of input voltages and temperture fluctuations. Additionally, the transistors provide a capacitive compensation circuit which stabilizes the output voltage of a band-gap reference circuit. The compensation circuit encompasses the electrical connecting of a PFET capacitor across the terminals of an NFET capacitor (preferably a low threshold voltage NFET), wherein the gate of the of the NFET capacitor is directly connected to an input lead, the substrate is grounded, and the source and drain are directly connected to a common output lead. The PFET is also directly connected to the the input lead and the output lead, however, instead of the substrate being grounded, the substrate of the PFET is electrically connected to the common output lead. This configuration results in a circuit which provides a steady capacitance across a wide range of voltages, and most importantly, during power-up of the reference circuit.

13 Claims, 8 Drawing Sheets

COMPENSATION TECHNIQUE USING MOS CAPACITANCE

TECHNICAL FIELD

The present invention relates generally to semiconductor devices. In particular, the present invention relates to a method of compensating a capacitance formed in an N-channel Field Effect Transistor (an "NFET").

BACKGROUND OF THE INVENTION

In many electronic circuits, a reference voltage is often used to compare voltages, determine the state of a memory cell, perform analog to digital conversions, and the like. A stable reference voltage is therefore often crucial to the successful operation of many electronic circuits.

Today, with the miniaturization and integration of most electronic circuits onto semiconductor devices ("chips"), reference voltages are commonly provided by circuits which utilize the gap between the valence and conduction bands (as shown in FIG. 1) found in semiconductor substrates (e.g., silicon and gallium arsenide). The gap between these energy bands, $E_g$ is commonly referred to as the band-gap. $E_g$ fluctuates with temperature (as shown in FIG. 2), and is typically 1.12 eV for silicon (Si) and 1.42 eV for gallium arsenide (GaAs) at room temperature.

Referring to FIG. 3, a common approach at providing a compensating circuit is to utilize an NFET capacitor 14 in an operational amplifier ("op amp") portion 12 (i.e., the circuit components within the dashed line) of a reference voltage circuit 10. While the NFET capacitor 14 provides good voltage stability once steady state operations have been achieved, at power-up the capacitance of the NFET capacitor 14 can vary widely. As a result, the voltage of the reference circuit, which the NFET capacitor 14 is designed to compensate, is often susceptible to large voltage swings, as shown by curve 18 in FIG. 4. In fact, it is common for improperly tuned reference voltage circuits to enter into an oscillating voltage pattern which impedes steady state operation of the circuit (as shown in the area 20 of FIG. 4). Often, these voltage oscillations are induced by the parasitic capacitance present in other components used in the reference voltage circuit (including, for example, resistors 16 (as shown in FIG. 3)).

A parasitic capacitance may arise in a resistor 16 in an integrated circuit because the resistor 16 is commonly formed from a diffusion, which has an associated parasitic capacitance. Capacitors and other electronic components are commonly formed from FETs using known processes, because using a FET is significantly less expensive. A FET component reduces the number of masks needed to produce an integrated circuit.

Ideally, resistors 16 are formed from a diffusion. When an inverse biased junction is applied across the resistor 16, a parasitic capacitance often arises. As a result, the parasitic capacitance of the resistors 16 (and other components) may induce a phase shift in the feedback loop of the reference circuit and may affect the stability of the reference voltage circuitry. Additionally, as shown in FIG. 4, the parasitic capacitance may result in a reference voltage which oscillates and never reaches a steady state value. Additionally, in the reference voltage circuitry 10, the NFET capacitor 14 is a low threshold voltage NFET. A low threshold voltage FET is utilized in the present application because the value of the capacitance for this particular FET starts to increase (i.e., ramp-up) when the voltage between nodes A and B is much lower. Since a low threshold voltage FET can only be built into the substrate of the FET, the substrate of the capacitor must be tied to ground. Thus, an NFET capacitor 14 must be utilized as the compensating capacitor.

Even when the resistors 16 are ideal, the use of FETs as capacitors often results in a capacitor with a varying capacitance. As shown in FIG. 5, when an NFET capacitor 14 is initially powered-up, the capacitance may vary widely depending upon the voltage across the poles (for example, A and B of the NFET capacitor 14 shown in FIG. 3). Thus, as the voltage increases during power-up, the capacitance may vary significantly such that obtaining a steady state capacitance is delayed and often problematic.

As is commonly known, electronic circuits are specifically designed with components operating within a predetermined range of values (capacitance, resistance, etc.). When the component's operating value (in this case the capacitance) fluctuates, the electronic circuit commonly will not perform as expected or as intended. Circuit designers require reliable components that operate within predetermined specifications. Hence, integrated circuit components which do not provide predictable and stable values, such as the NFET capacitor 14 in FIG. 3, must be improved.

Thus, currently available electronic devices do not provide a reliable compensating capacitor modeled out of a low threshold voltage FET.

SUMMARY OF THE INVENTION

The present invention provides an electrical circuit which provides a stable capacitance over a range of voltages. More particularly, the present invention provides a stable capacitance over a wide range of voltages by using a low threshold voltage (i.e., less than 0.5 volts) NFET coupled to a PFET.

The preferred embodiment of the present invention provides a steady capacitance, and thus a steady reference voltage in the form of a back-up capacitor, a PFET. The PFET is coupled to the input and outputs of an NFET capacitor such that when the NFET is receiving insufficient input voltage to provide the needed capacitance, the PFET is receiving sufficient input voltage, and vice versa. Thus, a compensating capacitance circuit is provided which enables sufficient capacitance to exist over a wider voltage range than is possible with solely an NFET capacitor. This greater capacitance range can be suitably used to stabilize the output voltage of a band-gap reference circuit.

Additionally, since the combined capacitance of the NFET and the PFET is enough to compensate for the parasitic capacitance generated by other electronic components, the present invention minimizes the effect of parasitic capacitances upon the output voltage of the band-gap reference circuit and thereby decreases and, in many cases, eliminates the effects of parasitic capacitance induced oscillations of the output voltage.

BRIEF DESCRIPTION OF THE DRAWING FIGURES

DETAILED DESCRIPTION OF A PREFERRED EMBODIMENT OF THE INVENTION

The present invention provides a compensating capacitance circuit which provides sufficient capacitance to enable a reference circuit to obtain steady state operations. More particularly, the present invention combines the performance of an NFET and a PFET capacitor in obtaining a resulting capacitance which is responsive to a wide range of input voltage levels. By combining the capacitance of an NFET and a PFET, the present invention diminishes the concern over parasitic capacitances which arise in many closed loop electronics architectures. Additionally, the present invention provides a predetermined capacitance to the op-amp in a band-gap reference circuit which requires a steady capacitance over a wide range of voltages.

While the present invention is described in the context of a band-gap reference, it is to be understood that the present invention is not to be so limited. Any transistorized circuit which requires a predetermined capacitance over a range of voltages may be accomplished by the present invention. Additionally, the present invention may be suitably associated with any capacitance value by utilizing known FET capacitor fabrication techniques. The known techniques for providing FET capacitors are beyond the scope of this description.

Figure 1:
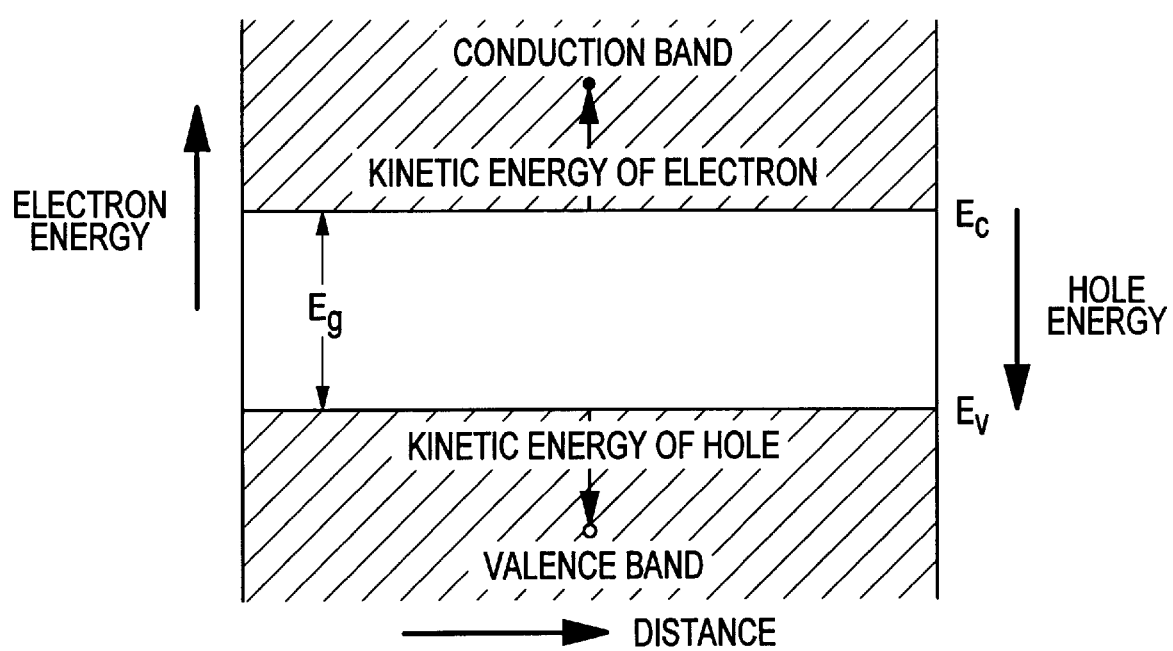
FIG. 1 is a schematic representation of the energy gap between the conduction band and the valence band of a semiconductor substrate.
Figure 2:
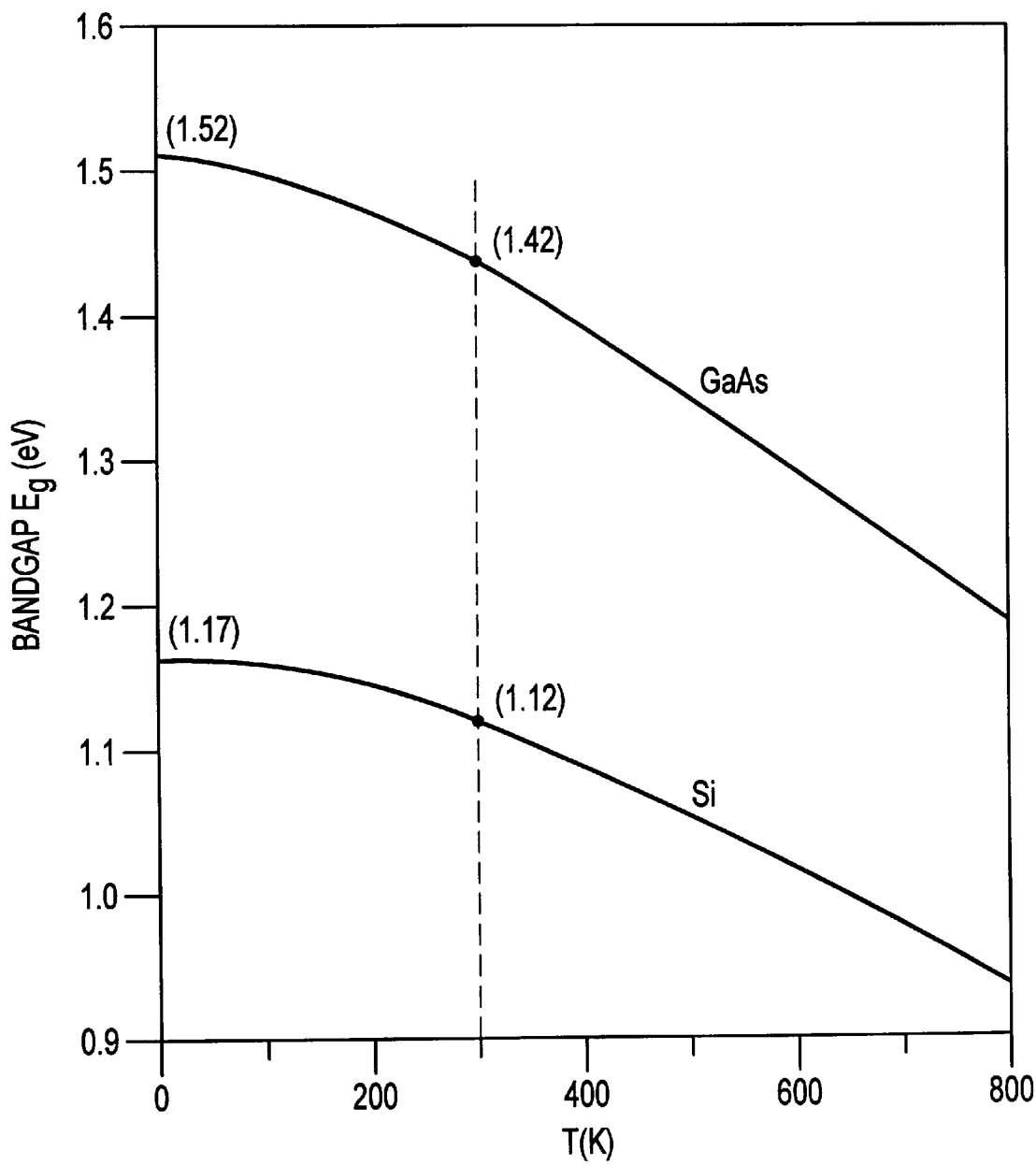
FIG. 2 is a graphical representation of the variation of the band gap energy with temperature in silicon and gallium arsenide semiconductor substrates.
Figure 3:
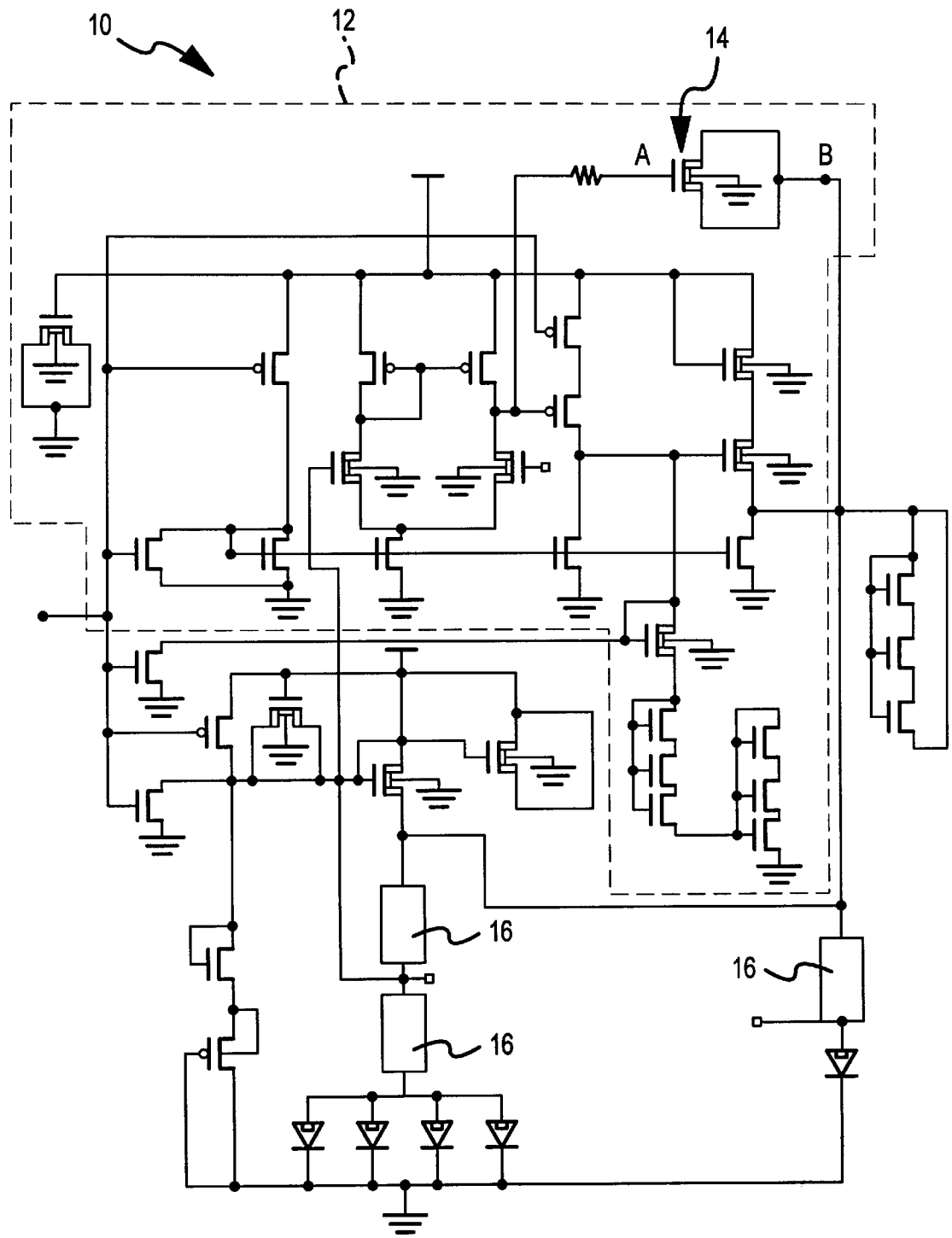
FIG. 3 is schematic representation of a prior art band-gap reference voltage circuit.
Figure 4:
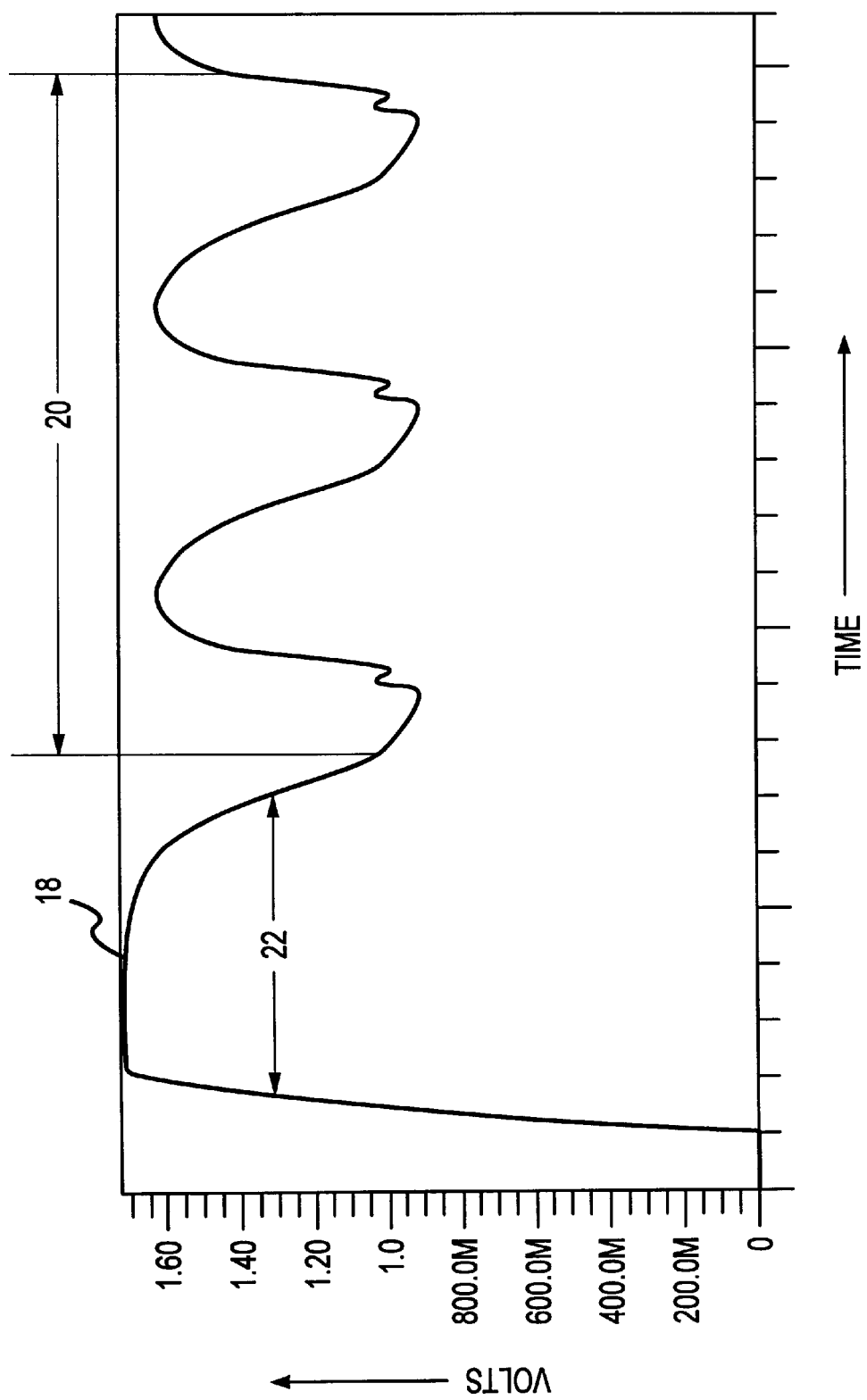
FIG. 4 is a graphical representation of the voltage versus time performance of the output voltage of the circuit shown in FIG. 3.
Figure 5A:
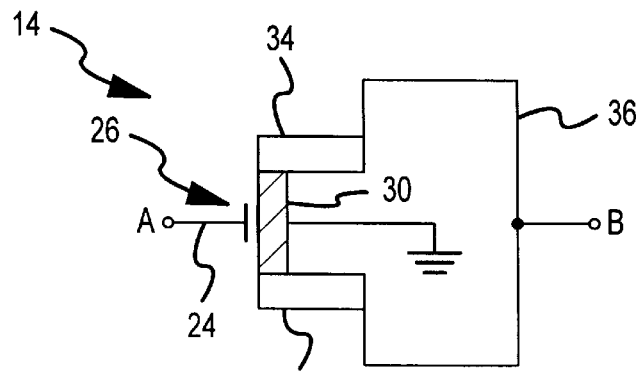
FIG. 5a is an electrical schematic representation of an NFET capacitor.
Figure 5B:
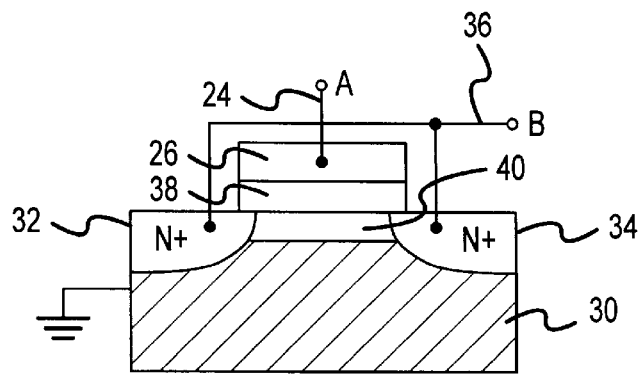
FIG. 5b is a cross-sectional view of an NFET capacitor.

As shown in FIGS. 5a and 5b, an NFET capacitor 14 may be suitably provided by connecting an input lead 24 to the gate 26 of the NFET capacitor 14, grounding the substrate 30, and connecting the source 32 and drain 34 together to an output lead 36. This configuration results in two plates separated by an insulator 38, wherein the first plate is the gate 26 and the second plate is combination of the source 32, the drain 34, and the channel 40 formed between the source 32 and drain 34.

Figure 6:
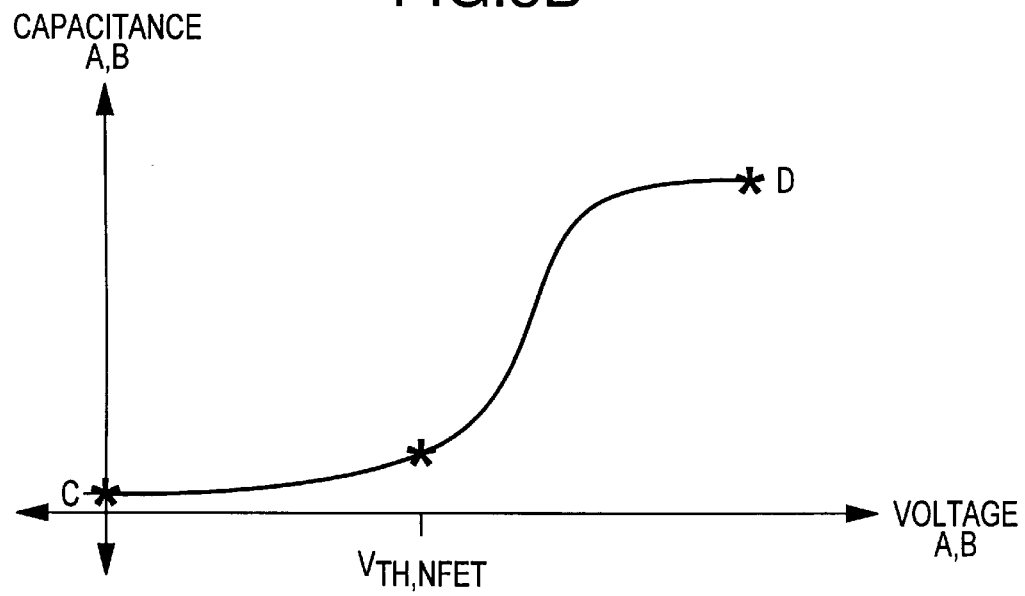
FIG. 6 is a graphical representation of the capacitance versus voltage characteristics of the NFET shown in FIGS. 5a and 5b.

The NFET capacitor 14 provided by the configuration shown in FIGS. 5a and 5b, suitably provides the capacitance versus voltage response characteristics shown in FIG. 6. As shown, the capacitance initially is very small, if not negligible, until the voltage across the NFET capacitor 14 reaches a threshold voltage $V_{th}$. Commonly, the negligible capacitance value "C" is one-tenth the steady state capacitance value "D". Thus, a wide disparity in capacitances (and thus output voltages) may occur when an NFET alone is utilized as a compensator in low voltage devices. In a practical embodiment, the capacitance may be set at any desired value in relation to a threshold voltage using known processes. This description does not set forth such techniques, and merely uses the graphs of FIGS. 6, 8, and 10 as representative of the characteristics of NFET and PFET capacitors, and the combination thereof.

Figure 7A:
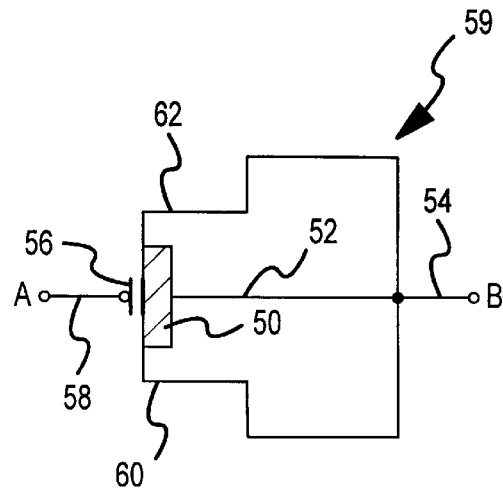
FIG. 7a is an electrical schematic representation of a PFET capacitor.
Figure 7B:
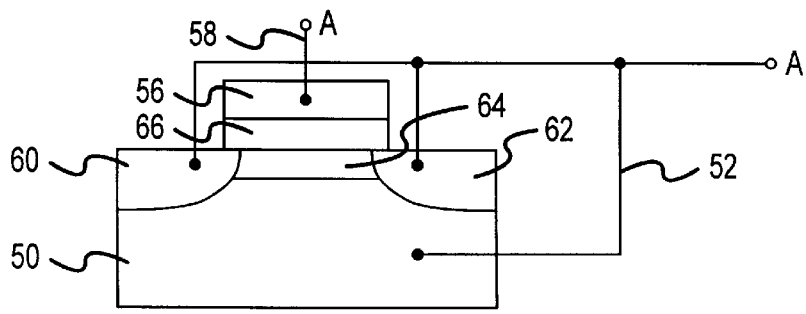
FIG. 7b is a cross-sectional view of a PFET capacitor.
Figure 8:
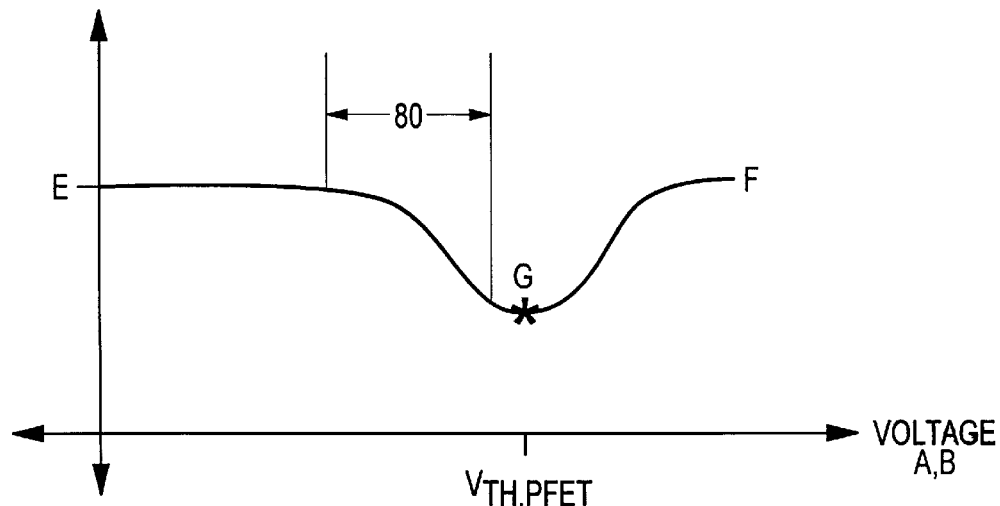
FIG. 8 is a graphical representation of the capacitance versus voltage characteristics of the PFET shown in FIGS. 7a and 7b.

In contrast, as shown in FIGS. 7a and 7b, a PFET capacitor 59 may be suitably configured by connecting the substrate 50, via lead 52, to the output lead 54. The gate 56 is connected to the input lead 58, and the source 60 and drain 62 are connected to the output lead 54. A channel 64 is formed between the source 60, the drain 62, and the substrate 50. The channel 64 is separated from the gate 56 by the isolator 66. Basically, this configuration utilizes the substrate 50 and the gate 56 as the plates of a capacitor. This configuration results in a capacitor which has the capacitance versus voltage response characteristics as shown in FIG. 8. As shown, the capacitance is nearly a constant value "E" across a wide range of voltages, dips briefly when the voltage across the PFET capacitor 59 approaches the threshold voltage "G" of the capacitor, and then returns to a constant capacitance "F" for higher voltages. Thus, the PFET capacitor 59 provides suitable steady-state capacitance at lower voltages, but dips at the threshold voltage. The fabrication of an actual PFET capacitor 59 is commonly known and will not be described herein.

Figure 9:
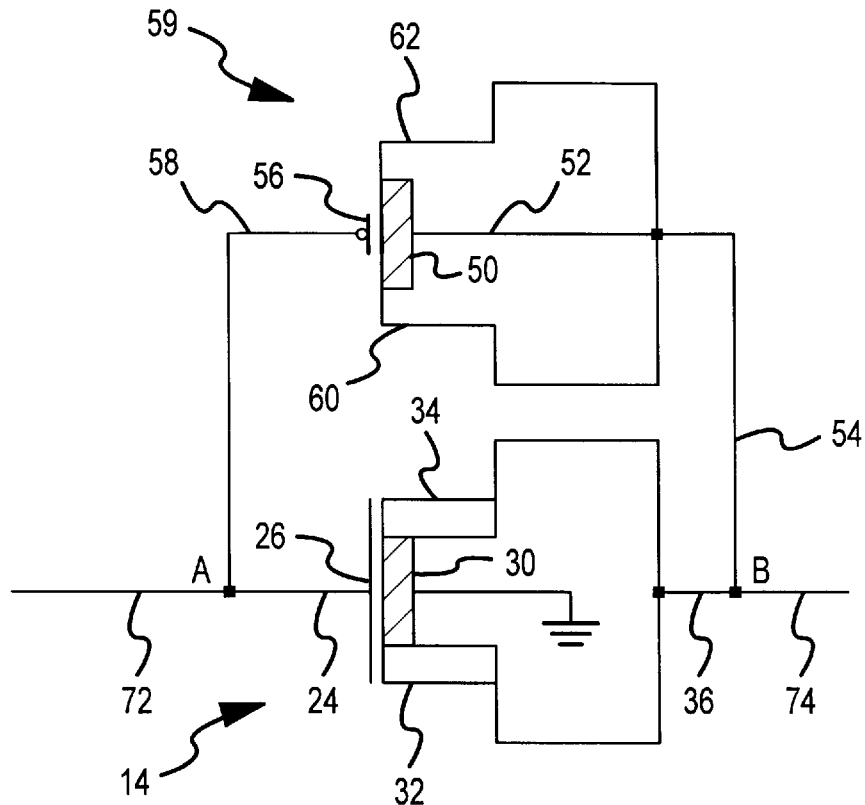
FIG. 9 is an electrical schematic representation of an exemplary combination of an NFET capacitor and a PFET capacitor under a preferred embodiment of the present invention.

An architecture in accordance with the present invention suitably combines a low threshold voltage NFET capacitor 14 (as shown in FIG. 5) with a PFET capacitor 59 (as shown in FIG. 7) resulting in the combined capacitative circuit shown in FIG. 9. As shown in FIG. 9, lead 72 (which connects the capacitive compensation circuit to the remainder of the band-gap reference circuit) is connected to lead 24 (i.e., to the NFET Capacitor 14) and lead 58 (i.e., to the PFET capacitor 59). Similarly lead 74 (which connects to the output of the band-gap reference circuit) is connected to lead 36 and lead 54.

Figure 10:
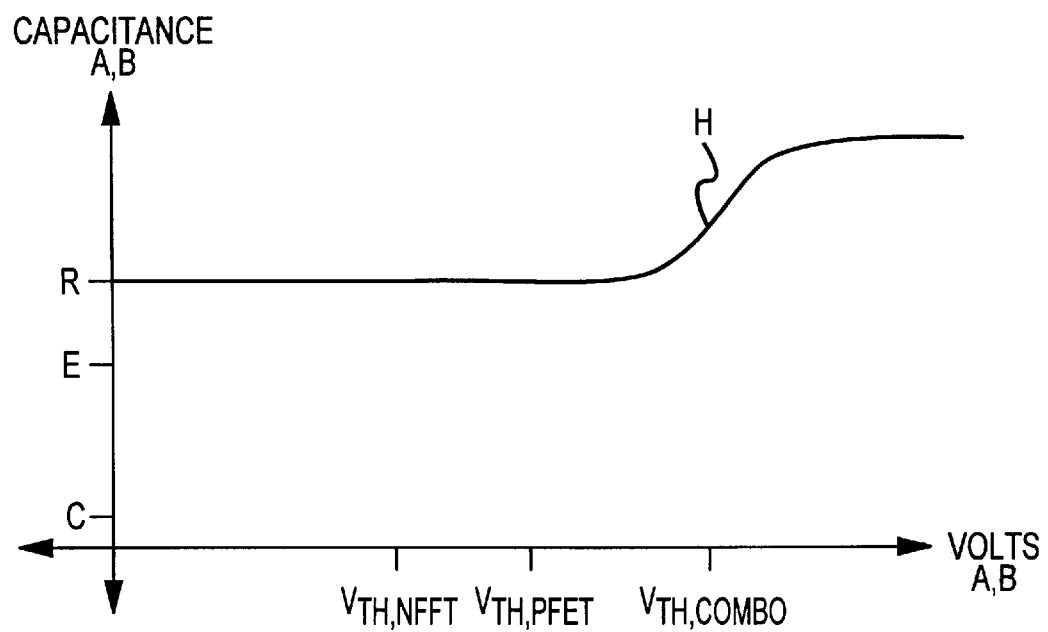
FIG. 10 is a graphical representation of the capacitance versus voltage characteristics of the combined NFET and PFET capacitance circuit shown in FIG. 9.
Figure 11:
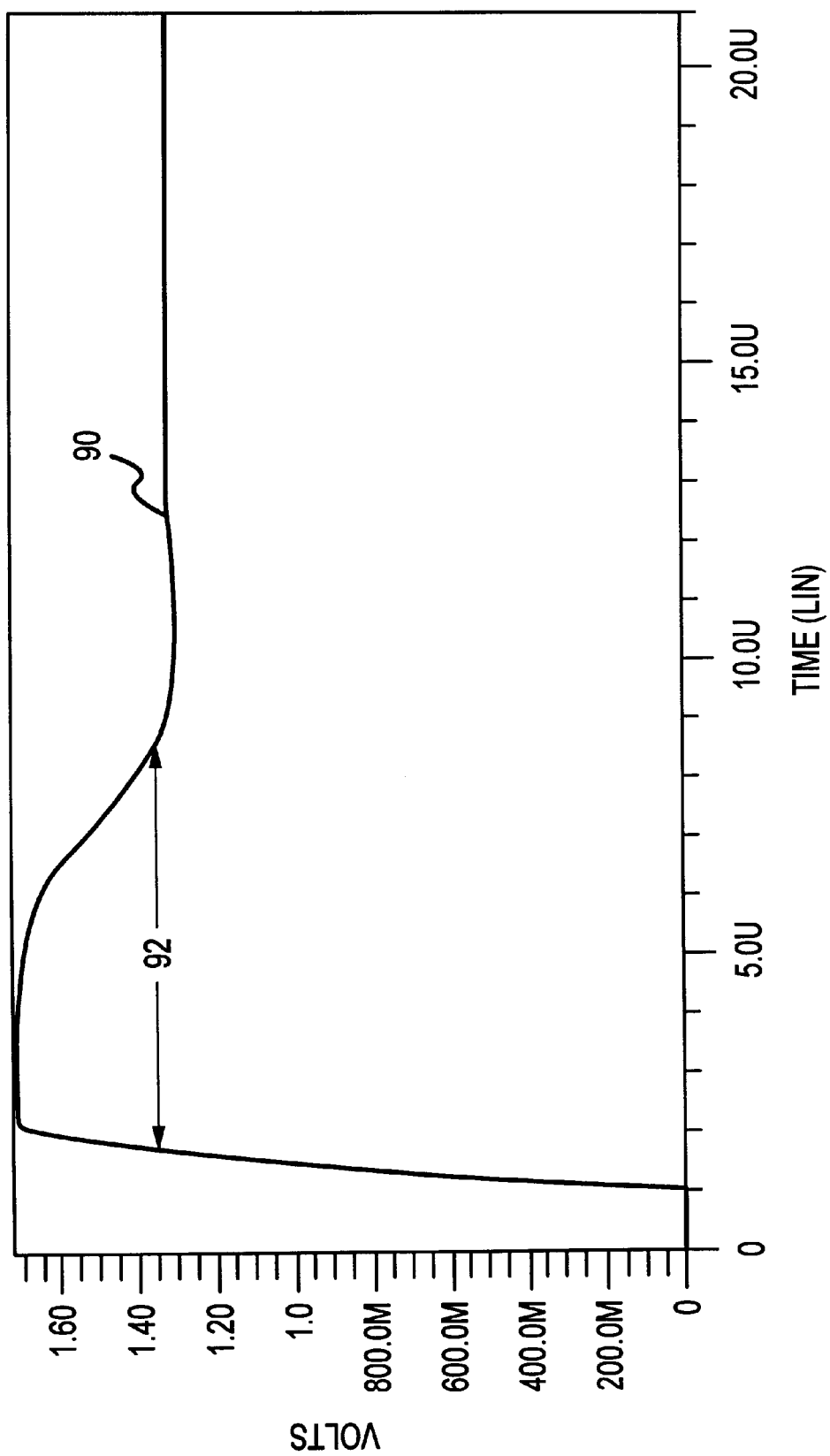
FIG. 11 is a graphical representation of the voltage versus time performance of an exemplary band-gap reference circuit utilizes a combination of an NFET capacitor and a PFET capacitor circuit to stabilize any oscillations that may arise under a preferred embodiment of the present invention.

When an exemplary PFET capacitor 59 and an exemplary NFET capacitor 14 are connected as shown in FIG. 9, the capacitance versus voltage characteristics may be as shown in FIG. 10. The resulting capacitance "R" is the combined capacitive effect of the capacitances obtained separately by the NFET capacitor 14 and the PFET capacitor 59. As shown, "R" is typically greater than either "C" or "E" across the voltage range. The value of "R" can preferably be set to any desired value by properly sizing the PFET and the NFET capacitors. Additionally, the threshold voltage of the combined circuit (as indicated by "H") is generally greater than the individual threshold voltages of the NFET capacitor 14 or the PFET capacitor 59. Preferably, this circuit is constructed such that the resulting capacitance "R" is sufficient to compensate for voltage fluctuations present in the band-gap reference (due to insufficient voltage drop across the capacitor during power-up), and sufficient to obtain a substantially constant output reference voltage 90 in a relatively quick settling time 92, as shown in FIG. 11.

In operation, as the voltage across the capacitors (i.e., the NFET capacitor 14 and the PFET capacitor 59) drops, the NFET capacitor 14 tends to turn off (i.e., fails to provide a sufficient capacitance) while the PFET capacitor 59 is driven deeper into the accumulation region 80 (as shown in FIG. 8). This characteristic may occur in response to any drop in voltage, e.g., during power-up, as a result of noise, etc. As a result, the capacitance of the PFET capacitor 59 backs up the capacitance of the NFET capacitor 14 and ensures that sufficient capacitance exists to compensate for any output voltage fluctuations. Thus, the present invention provides a capacitive compensator in an op-amp for a band gap reference circuit which ensures a steady output voltage may be generated.

While the present invention has been described in the context of a band-gap reference circuit, it is to be understood that the present invention is not to be so limited. The capacitance circuit of the present invention may be utilized in any electrical circuit which utilizes FETs as capacitors and desires a stable capacitance over a range of voltages.

Although the present invention has been described in conjunction with a preferred embodiment, the scope of the invention is not to be so limited. Modification may be made to the underlying circuitry, the FETs, the capacitance versus voltage characteristics of the FETs, the materials used, or any other element, factor, step, or the like without departing from the spirit or scope of the present invention as expressed in the following claims.

I claim:

1. A circuit which provides a minimum capacitance over a range of voltages comprising:

an input lead upon which an input voltage is received;

an output lead;

an NFET having an NFET gate, an NFET source, an NFET drain, and an NFET substrate, wherein said NFET gate is directly connected to said input lead, said NFET substrate is electrically connected to a grounding potential, and said NFET source and NFET drain are each directly connected to said output lead; and a PFET having a PFET gate, a PFET substrate, a PFET source, and a PFET drain, wherein said PFET gate is directly connected to said input lead, and said PFET substrate, said PFET source, and said PFET drain are each directly connected to said output lead.

2. The circuit of claim 1 wherein said NFET is configured to operate as a capacitor having a capacitance that is low when said input voltage is below a predetermined threshold voltage, said capacitance increases as said input voltage approaches said threshold voltage, and said capacitance stabilizes at a higher capacitance value when said input voltage exceeds said threshold voltage.

3. The circuit of claim 1 wherein said PFET is configured to operate as a capacitor having a steady capacitance value across the range of voltages except when said input voltage is within the proximity of a threshold voltage associated with said capacitor, such that input voltages within the proximity of said threshold voltage decrease said capacitance to a locally minimum value.

4. The circuit of claim 1 wherein said circuit is used in a band-gap reference circuit.

5. The circuit of claim 1 wherein said NFET and said PFET are arranged as a combined capacitance which provides at least the minimum capacitance across the range of voltages for said input voltage, wherein said combined capacitance is capable of stabilizing an output voltage.

6. The circuit of claim 1 wherein said NFET and said PFET are arranged as a combined capacitance which provides a capacitance that compensates the effects of any parasitic capacitance arising from any additional components in a circuit with which said NFET and PFET are associated.

7. A capacitive compensation method for providing a substantially steady voltage level at an output lead, said method comprising the steps of:

a. electrically connecting an NFET to a circuit wherein said NFET has an NFET gate, an NFET substrate, an NFET source, and an NFET drain such that said NFET gate is directly connected to an input lead, said NFET substrate is grounded, and said NFBT source and said NFET drain are each directly connected to said output lead; and b. electrically connecting a PFET to said circuit wherein said PFET has a PFET gate, a PFET substrate, a PFET source, and a PFET drain such that said PFET gate is directly connected to said input lead, and said PFET substrate, said PFET source, and said PFET drain are each directly connected to said output lead.

8. The method of claim 7 wherein said NFET is a low threshold voltage NFET.

9. The method of claim 7 wherein said NFET provides a first capacitance wherein said first capacitance is a low value when an input voltage upon said input lead is below a predetermined threshold voltage, said first capacitance increases as said input voltage approaches a threshold voltage associated with said NFET, and said first capacitance stabilizes at a higher capacitance value when said input voltage exceed said threshold voltage.

10. The method of claim 9 wherein said PFET provides a second capacitance wherein said second capacitance is a steady value across a voltage range except when said input voltage is within the proximity of a second threshold voltage associated with said PFET, such that input voltages within said proximity decrease said second capacitance to a locally minimum value.

11. The method of claim 10 wherein said second capacitance compensates for said low value associated with said first capacitance when said input voltage is low, said first capacitance compensates for said locally minimum value associated with said second capacitance when said input voltage is within said proximity of said second threshold voltage such that across the voltage range said first capacitance and said second capacitance combined provide a steady capacitance at said output lead.

12. The method of claim 11 wherein said steady capacitance is of such value that any effects from parasitic capacitance arising from any component within said circuit is compensated.

13. The method of claim 7 wherein said circuit is a band-gap reference circuit.

* * * * *